(12) United States Patent
Zhou et al.

(10) Patent No.: US 9,028,725 B2
(45) Date of Patent: May 12, 2015

(54) SINTERING PROCESS FOR THERMOELECTRIC MATERIALS

(75) Inventors: Li Qin Zhou, Ann Arbor, MI (US); Michael Paul Rowe, Pinckney, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 352 days.

(21) Appl. No.: 12/961,815

(22) Filed: Dec. 7, 2010

(65) Prior Publication Data

US 2012/0138873 A1    Jun. 7, 2012

(51) Int. Cl.
| | | |
|---|---|---|
| C04B 35/453 | (2006.01) |
| H01L 35/16 | (2006.01) |
| H01L 35/22 | (2006.01) |
| C04B 35/547 | (2006.01) |
| C04B 35/626 | (2006.01) |
| C04B 35/645 | (2006.01) |

(52) U.S. Cl.
CPC ............. *C04B 35/453* (2013.01); *H01L 35/16* (2013.01); *H01L 35/22* (2013.01); *C04B 35/547* (2013.01); *C04B 35/6262* (2013.01); *C04B 35/645* (2013.01); *C04B 2235/3284* (2013.01); *C04B 2235/3294* (2013.01); *C04B 2235/3298* (2013.01); *C04B 2235/446* (2013.01); *C04B 2235/77* (2013.01)

(58) Field of Classification Search
USPC .......................................................... 419/38
IPC ........... B22F 2999/00; H01L 35/16; H01B 1/08
See application file for complete search history.

(56) References Cited

U.S. PATENT DOCUMENTS

| | | | |
|---|---|---|---|
| 3,950,166 A | | 4/1976 | Obara et al. |
| 4,243,621 A | | 1/1981 | Mori et al. |
| 5,318,743 A | * | 6/1994 | Tokiai et al. ................ 419/38 |
| 5,521,148 A | | 5/1996 | Torii et al. |
| 2008/0087314 A1 | * | 4/2008 | Xiao et al. ................ 136/201 |

* cited by examiner

*Primary Examiner* — Weiping Zhu
(74) *Attorney, Agent, or Firm* — Gifford, Krass, Sprinkle, Anderson & Citkowski, P.C.

(57) ABSTRACT

A process for densifying a composite material is provided. In some instances, the process can reduce stress in a sintered component such that improved densification and/or properties of the component is provided. The process includes providing a mixture of a first material particles and second material particles, pre-sintering the mixture at a first pressure and a first temperature in order to form a pre-sintered component, and then crushing, grinding, and sieving the pre-sintered component in order to form or obtain a generally uniform composite powder. The uniform composite powder is then sintered at a second pressure and a second temperature to form a sintered component, the second pressure being greater than the second pressure.

18 Claims, 3 Drawing Sheets

SINTERING PROCESS FOR THERMOELECTRIC MATERIALS

FIELD OF THE INVENTION

The present invention relates to a process for making a sintered component and, in particular, to a process for making a sintered component containing a thermoelectric material.

BACKGROUND OF THE INVENTION

Thermoelectric materials and devices can be utilized to obtain electrical energy from a thermal gradient. Such materials have a limited thermoelectric conversion efficiency which can be defined in terms of the formula $ZT=S^2\sigma/\kappa \times T$. The figure of merit (ZT) is related to the macroscopic transport parameters of the material which are a function of the Seebeck coefficient (S), the electrical conductivity ($\sigma$), and the thermal conductivity ($\kappa$).

In order to improve the thermoelectric conversion efficiency of a thermoelectric material or component, one can attempt to increase the Seebeck coefficient and/or the electrical conductivity while decreasing the thermal conductivity. However, increasing the ZT has proven difficult since the three parameters S, $\sigma$, and $\kappa$ are interrelated. For example, doping of a specific material can increase the electrical conductivity but decrease the Seebeck coefficient and/or increase the thermal conductivity.

Nanostructured materials have been studied to produce thermoelectric materials that have improved or higher figures of merit. However, such nanostructured materials can be difficult and expensive to manufacture. In addition, heretofore processing of such nanostructured materials has failed to provide thermoelectric material components having optimized properties. Therefore, an improved process that affords for optimum properties of thermoelectric material components would be desirable.

SUMMARY OF THE INVENTION

A process for densifying a composite material is provided. In some instances, the process can reduce stress in a sintered component such that improved densification and/or properties of the component is provided. The process includes providing a first material and a second material in particulate form, mixing the first material and the second material, and then pre-sintering the first material and the second material mixture at a first pressure and a first temperature in order to form a pre-sintered component. Thereafter, the pre-sintered component is subjected to crushing, grinding, and sieving in order to form or obtain a generally uniform composite powder. The uniform composite powder is then sintered at a second pressure and a second temperature to form a sintered component, the second pressure being greater than the first pressure.

In some instances, the first material and the second material can chemically react with each other during the pre-sintering step such that internal and/or residual stress is created within the pre-sintered component. As such, it is appreciated that crushing, grinding, and sieving the pre-sintered component to form a generally uniform composite powder eliminates such stress and affords for a subsequent sintered component to have improved densification, mechanical properties, chemical properties, and/or physical properties.

The second material can be less thermally conductive than the first material. For example and for illustrative purposes only, the first material can be a thermoelectric material while the second material can be an oxide. In addition, the first material can be a plurality of thermoelectric material nanoparticles while the second material can be a plurality of oxide nanoparticles. In some instances, the first pressure can be less than 10 megapascals and the second pressure can be greater than 50 megapascals. In other instances, the first pressure is less than 1 megapascal while the second pressure is greater than 50 megapascals. In still other instances, the first pressure can be atmospheric pressure while the second pressure is greater than 50 megapascals. The use of such a process can provide a sintered component that has a density greater than 99% of a theoretical density for the composite material.

DETAILED DESCRIPTION OF THE PRESENT INVENTION

Figure 1:
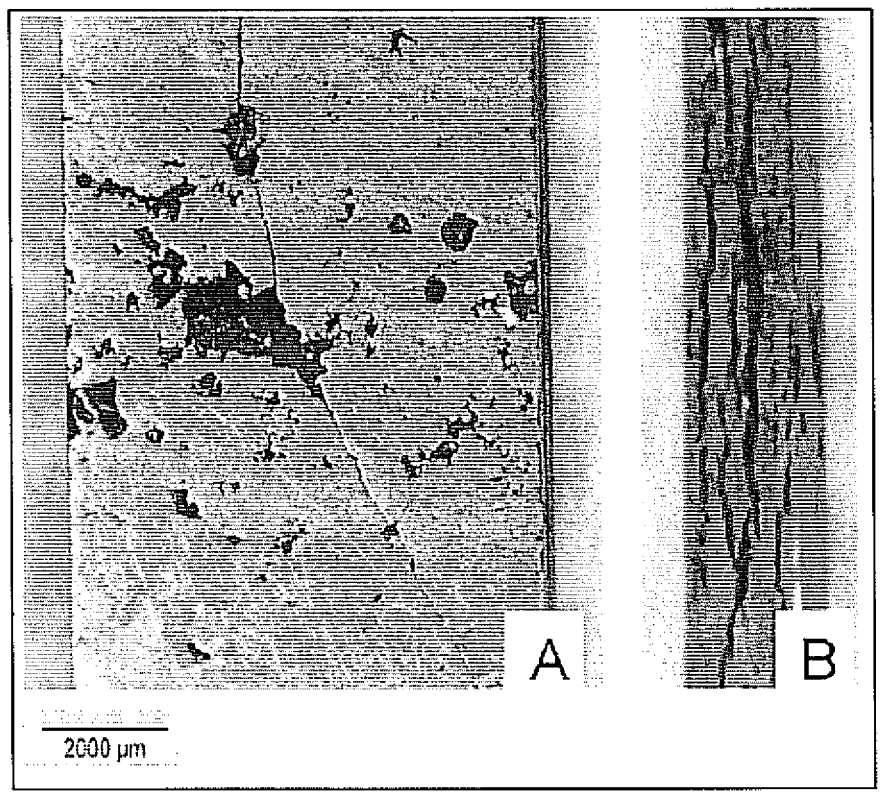
FIG. 1 is an optical microscopy image of a thermoelectric composite component produced using a one-step sintering process.

The present invention discloses a process for densifying a composite material using a two-step sintering technique. As such, the present invention has utility as a process for making a component.

The process can include providing a first material and a second material, both materials being in particulate form. The first material and the second material are pre-sintered using a first pressure and a first temperature in order to form a pre-sintered component. The pre-sintered component is then subjected to crushing, grinding, and sieving in order to form a generally uniform composite powder. The generally uniform composite powder is then sintered at a second pressure and a second temperature in order to form a sintered component. The second pressure is greater than the first pressure; and in some instances, the second pressure is much greater than the first pressure.

The inventive two-step sintering process can also reduce stress that is present within a final sintered component. For example, the first material and the second material can chemically react with each other during the pre-sintering step, and as such, stress generated during the pre-sintering step is naturally removed during the crushing and grinding thereof, and partially or completely reacted powder is provided for the sintering step. Therefore, it is appreciated that the second sintering step is not an alloying step, i.e. alloying between the first material and the second material generally does not occur during the second sintering step.

The second material can be less thermally conductive than the first material. For example and for illustrative purposes only, the first material can be a thermoelectric material and the second material can be an oxide, for example a bismuth (Bi) chalcogenide and a metal oxide. In addition, the thermoelectric material and the oxide can be in the form of nanoparticles. In some instances, the first material is a bismuth telluride (Te) and the second material is zinc oxide (ZnO). The bismuth telluride can be an antimony (Sb) doped bismuth telluride such as $(BiSb)_2Te_3$.

The first pressure can be less than 10 megapascals while the second pressure can be greater than 50 megapascals. In some instances, the first pressure can be less than 1 megapascal (MPa), e.g. as atmospheric pressure, while the second pressure can be greater than 50 MPa, e.g. 100 MPa. A sintered component made according to the inventive process disclosed herein can have a density that is greater than 99% of a theoretical density for the composite material, a density that is greater than 99.5% theoretical density of the material, and/or a density that is equal to or greater than 99.9% of the theoretical density of the material.

In the event that the first material is a bismuth telluride and the second material is zinc oxide, a sintered component produced using the two-step sintering process disclosed herein can have a figure of merit (ZT) greater than 1.0.

In order to better illustrate and teach the present invention, an example of a two-step sintering process and the benefits thereof are provided below.

Example

Referring now to FIG. 1, optical microscopy images of a bismuth telluride-zinc oxide composite component made from nanoparticles of $(BiSb)_2Te_3$ and nanoparticles of ZnO sintered at 400° C. under 100 MPa of pressure for 4 hours are shown. FIG. 1A is an image of a top or bottom surface of the component while FIG. 1B is an image of a side edge or surface of the component. As shown in the image, the single-step sintered component exhibited a plurality of cracks, voids, and the like. In addition, the single-step sintered component had a density of 81.2% of theoretical density for the bismuth telluride-zinc oxide composite.

Figure 2:
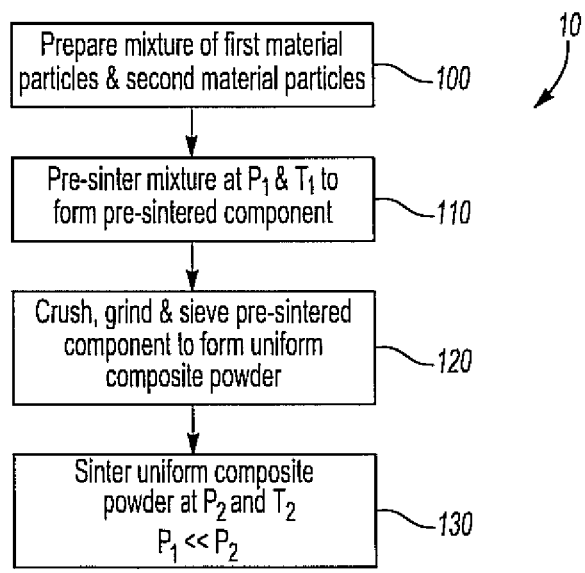
FIG. 2 is a schematic diagram illustrating an inventive process for making a sintered component.

Turning now to FIG. 2, a schematic diagram and/or flowchart of an inventive two-step sintering process is shown generally at reference numeral 10. The process 10 includes preparing a mixture of first material particles and second material particles at step 100, followed by pre-sintering the mixture at a first pressure $P_1$ and a first temperature $T_1$ in order to form a pre-sintered component at step 110. The pre-sintered component is then subjected to crushing, grinding, and sieving at step 120, the result being the production of uniform composite powder. Thereafter, the uniform composite powder is sintered at a second pressure $P_2$ and a second temperature $T_2$ at step 130. The second pressure $P_2$ is greater than the first pressure $P_1$, and in some instances the second pressure $P_2$ is much greater than the first pressure $P_1$.

Figure 3:
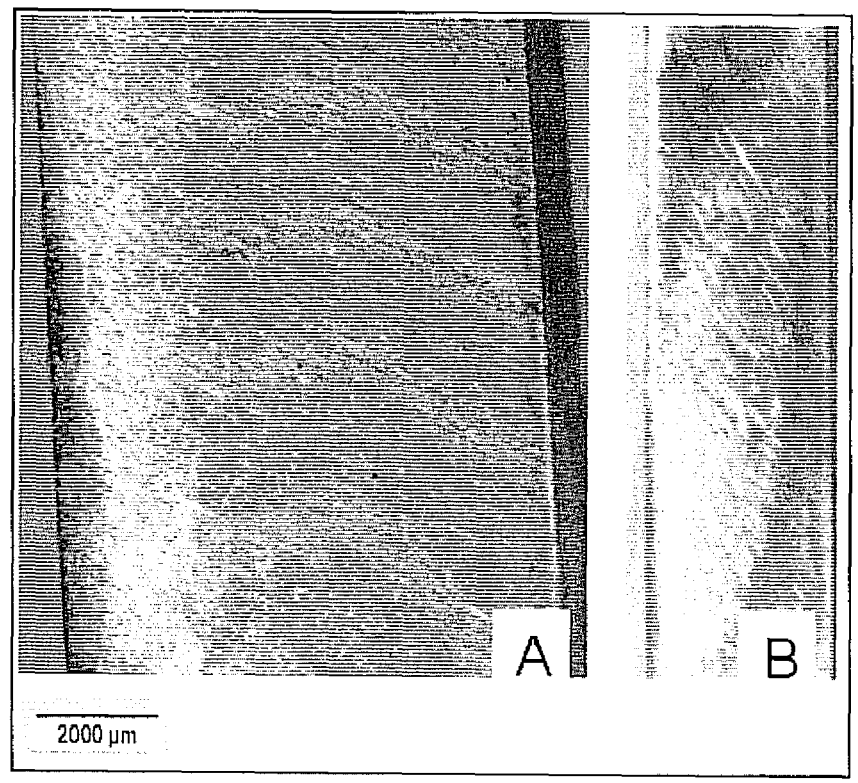
FIG. 3 is an optical microscopy image of a sintered component made according to an embodiment of the present invention.

Optical microscopy images of a sintered component made according to a two-step sintering process as illustrated in FIG. 2 are shown in FIG. 3 with FIG. 3A Figure being an image of a top or bottom surface and FIG. 3B being an image of a side edge or surface. As shown in these images, and in contrast to the images shown in FIG. 1, no cracks, voids, and the like are present and/or visible.

The sintered component shown in FIG. 3 was produced by first taking a mixture of bismuth telluride nanoparticles and zinc oxide nanoparticles and pre-sintering the mixture at 400° C. for 2 hours with no externally applied pressure, i.e. under atmospheric pressure. The pre-sintering step produced a pre-sintered component which was then crushed, ground, and sieved, the result being the production of a uniformly fine composite powder. The composite powder was then sintered at 400° C. under 100 MPa of pressure for 4 hours which resulted in a fully dense sintered component having a density of 99.9% of the theoretical density for the bismuth telluride-zinc oxide composite.

Figure 4:
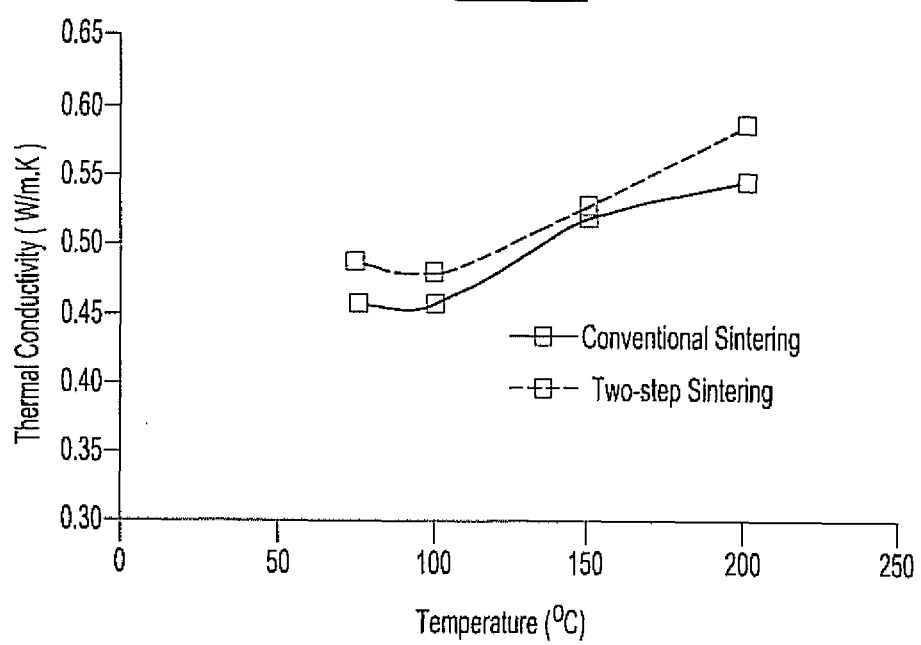
FIG. 4 is a graph illustrating thermal conductivity as a function of temperature for a sintered component manufactured using a conventional sintering process and a sintered component manufactured using a two-step sintering process according to an embodiment of the present invention.
Figure 5:
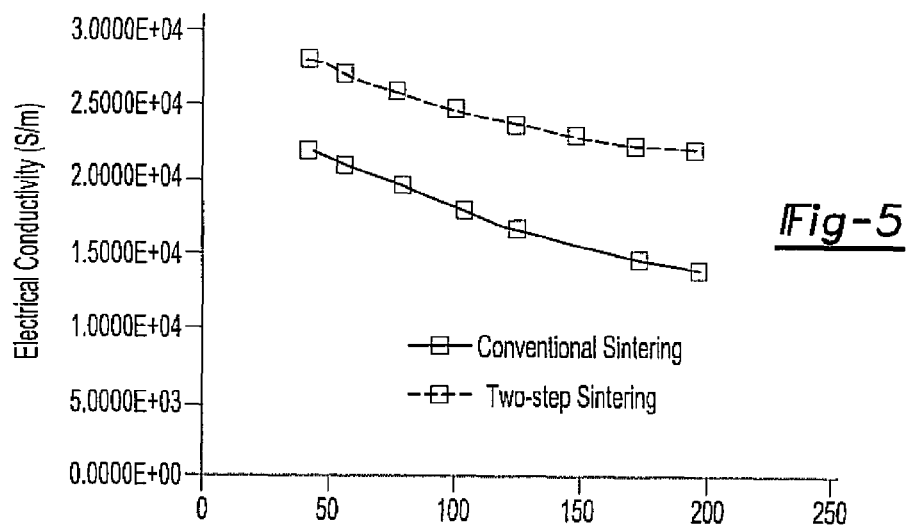
FIG. 5 is a graph of electrical conductivity as a function of temperature for a sintered component manufactured using a conventional sintering process and a sintered component manufactured using a two-step sintering process according to an embodiment of the present invention.

Physical property testing was conducted on sintered component produced using the conventional one-step sintering process disclosed above and the inventive two-step sintering process. FIG. 4 provides a graph of the thermal conductivity as a function of temperature for the two sintered components showing similar thermal conductivity. In addition, FIG. 5 shows improved electrical conductivity for the two-step sintered component when compared to the conventional one-step sintered component. Finally, the two-step sintered component shows an improved Seebeck coefficient as a function of temperature when compared to the conventional one-step sintered component as illustrated in FIG. 6.

Figure 6:
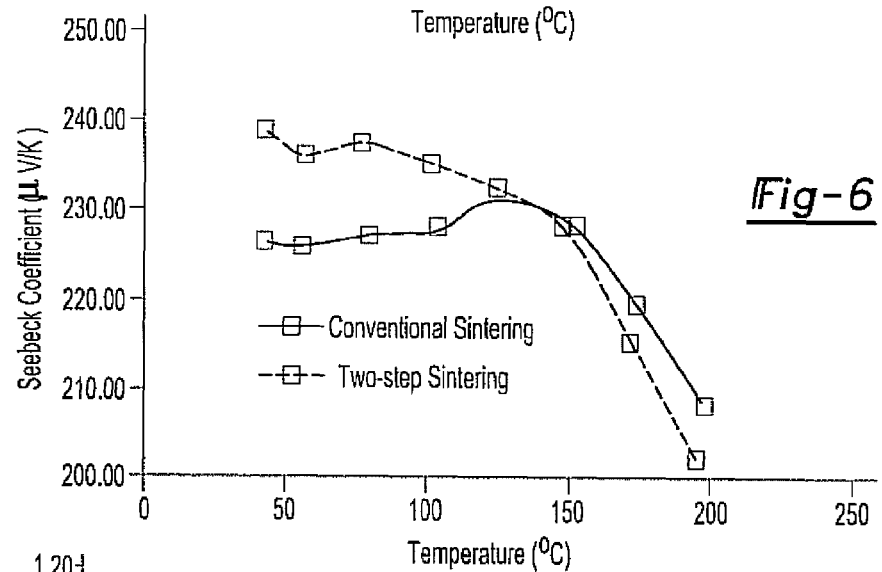
FIG. 6 is a graph of Seebeck coefficient as a function of temperature for a sintered component manufactured using a conventional sintering process and a sintered component manufactured using a two-step sintering process according to an embodiment of the present invention.
Figure 7:
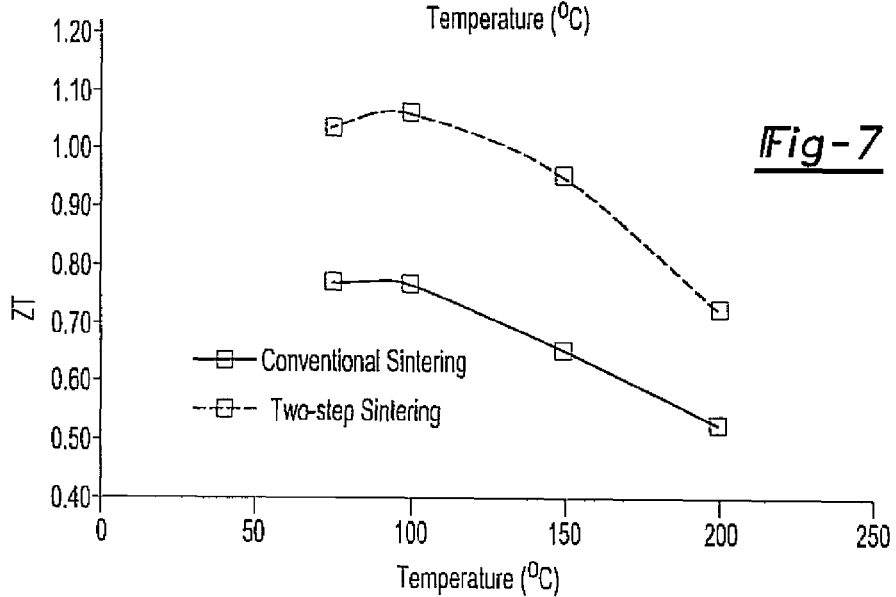
FIG. 7 is a graph of ZT as a function of temperature for a sintered component manufactured using a conventional sintering process and a sintered component manufactured using a two-step sintering process according to an embodiment of the present invention.

Based on the physical property data illustrated in FIGS. 4-6, the figure of merit (ZT) was calculated for the conventional one-step sintered component and the two-step sintered component. FIG. 7 shows the results of the calculations with the component manufactured using the inventive two-step sintering process showing an improvement of at least 30% over the conventional one-step sintered component in the temperature range of 75 to 200° C. In addition, the inventive two-step sintering process afforded for a component that exhibited an improvement in ZT equal to or greater than 40% in the temperature range of 75 to 150° C. when compared to the component produced using the conventional one-step sintering process.

Although the example has been provided for a thermoelectric material composite, it is appreciated that the two-step sintering process in which a pre-sintered component is subjected to crushing, grinding, and sieving in order to provide a uniform composite powder which is then sintered in a second step can be used to reduce and/or eliminate stress within a final sintered component. As such, the sintering of a composite material in which a first material chemically reacts with a second material, the result being the generation of stress within a final sintered component, can benefit from the inventive process disclosed herein. As such, it is to be understood that numerous modifications and variations of the present invention will be readily apparent to those of skill in the art. In addition, the foregoing is illustrative of specific embodiments of the invention but is not meant to be a limitation upon the practice thereof. It is the following claims, including all equivalents, which define the scope of the invention.

We claim:

1. A process for densifying a thermoelectric composite material using a two-step sintering process instead of a conventional one-step sintering process, the processing comprising:

providing a first material including a plurality of thermoelectric material particles and a second material including a plurality of separate oxide nanoparticles;

mixing the first material and the second material;

pre-sintering the first material and second material mixture at a first pressure and a first temperature to form a pre-sintered component;

crushing, grinding and sieving the pre-sintered component to form a generally uniform composite powder; and sintering the generally uniform composite powder at a second pressure and a second temperature to form a sintered component, the first pressure being less than the second pressure, the sintered component having a figure of merit (ZT) greater than 30% compared to a one-step sintered component made from the same first material and second material.

2. The process of claim 1, wherein the first material and the second material chemically react with each other during the pre-sintering and sintering.

3. The process of claim 2, wherein the second material is less thermally conductive than the first material.

4. The process of claim 3, wherein the first material is a plurality of thermoelectric material nanoparticles.

5. The process of claim 4, wherein the first material is a bismuth chalcogenide and the second material is metal oxide.

6. The process of claim 5, wherein the first material is a bismuth telluride and the second material is zinc oxide.

7. The process of claim 6, wherein the bismuth telluride is $(BiSb)_2Te_3$.

8. The process of claim 7, wherein the sintered component has a figure of merit greater than 1.0 in the temperature range of 75 to 125° C.

9. The process of claim 1, wherein the first pressure is less than 1 MPa and the second pressure is greater than 50 MPa.

10. The process of claim 9, wherein the first pressure is atmospheric pressure and the second pressure is greater than 50 MPa.

11. The process of claim 1, wherein the sintered component has a density of greater than 99% of a theoretical density for the composite material.

12. A process for reducing stress in a sintered thermoelectric component made from a composite material by using a two-step sintering process instead of a conventional one-step sintering process, the process comprising:

providing a first material including a plurality of thermoelectric particles and a second material including a plurality of separate oxide nanoparticles;

mixing the first material and the second material;

pre-sintering the first material and second material mixture at a first pressure and a first temperature to form a pre-sintered component, the first material and the second material chemically reacting and producing stress within the pre-sintered component;

crushing, grinding and sieving the pre-sintered component to form a generally uniform composite powder; and sintering the generally uniform composite powder at a second pressure and a second temperature to form a sintered component, the first pressure being much less than the second pressure, the sintered component having reduced stress when compared to a component made from the first material and the second material using a single-step sintering process at a pressure at least as great as the second pressure and a temperature at least as great as the first temperature or the second temperature, the sintered component also having at least a 30% greater figure of merit (ZT) than a one-step sintered component made from the same first material and second material.

13. The process of claim 12, wherein the first material is a plurality of thermoelectric material nanoparticles.

14. The process of claim 13, wherein the first material is a bismuth chalcogenide and the second material is metal oxide.

15. The process of claim 14, wherein the first material is a bismuth telluride and the second material is zinc oxide.

16. The process of claim 12, wherein the first pressure is less than 1 MPa and the second pressure is greater than 50 MPa.

17. The process of claim 16, wherein the first pressure is atmospheric pressure and the second pressure is greater than 50 MPa.

18. The process of claim 12, wherein the sintered component has a density greater than 99% of a theoretical density of the composite material.

\* \* \* \* \*